United States Patent
Yanagidate

(10) Patent No.: US 8,744,028 B2
(45) Date of Patent: Jun. 3, 2014

(54) DATA COMMUNICATION SYSTEM AND RECEIVING DEVICE

(75) Inventor: Masaharu Yanagidate, Sagamihara (JP)

(73) Assignee: Olympus Corporation, Tokyo (JP)

( * ) Notice: Subject to any disclaimer, the term of this patent is extended or adjusted under 35 U.S.C. 154(b) by 814 days.

(21) Appl. No.: 12/713,537

(22) Filed: Feb. 26, 2010

(65) Prior Publication Data

US 2010/0220827 A1 Sep. 2, 2010

(30) Foreign Application Priority Data

Mar. 2, 2009 (JP) ................................. 2009-047943

(51) Int. Cl.
*H04L 7/00* (2006.01)

(52) U.S. Cl.
USPC .......................................................... 375/354

(58) Field of Classification Search
USPC .......................................................... 375/354
See application file for complete search history.

(56) References Cited

U.S. PATENT DOCUMENTS

| | | | |
|---|---|---|---|
| 7,564,922 B2 * | 7/2009 | Kim et al. ...................... | 375/297 |
| 2005/0117476 A1 * | 6/2005 | Katsuta et al. .............. | 369/47.24 |
| 2006/0120685 A1 * | 6/2006 | Sako ................... | 386/1 |
| 2006/0274864 A1 * | 12/2006 | Ohama et al. ................. | 375/344 |
| 2007/0092035 A1 * | 4/2007 | Kim ............... | 375/296 |
| 2008/0025729 A1 * | 1/2008 | Funada .......... | 398/136 |
| 2008/0042621 A1 * | 2/2008 | Miglioranza ................. | 320/150 |

FOREIGN PATENT DOCUMENTS

| | | | |
|---|---|---|---|
| JP | 63-313930 | A | 12/1988 |
| JP | 05-091006 | A | 4/1993 |
| JP | 05-119083 | A | 5/1993 |
| JP | 2000-005136 | A | 1/2000 |
| JP | 2004-144683 | A | 5/2004 |
| JP | 2005-085193 | A | 3/2005 |
| JP | 2006-008086 | A | 1/2006 |
| JP | 2006-284192 | A | 10/2006 |
| JP | 2007-187659 | A | 7/2007 |
| JP | 3954382 | B2 | 8/2007 |
| WO | 01/10291 | A1 | 2/2001 |

OTHER PUBLICATIONS

Japanese Office Action dated Jun. 18, 2013, issued in corresponding Japanese Patent Application No. 2009-047943, w/English translation.

* cited by examiner

*Primary Examiner* — Chieh M Fan
*Assistant Examiner* — Tanmay Shah
(74) *Attorney, Agent, or Firm* — Westerman, Hattori, Daniels & Adrian, LLP

(57) ABSTRACT

A data communication system comprises a transmitting device which transmits data and a receiving device which receives the data. The transmitting device comprises a clock generating circuit and a transmitting unit. The clock generating circuit generates a clock having a temperature characteristic in that a clock frequency varies with temperature. The transmitting unit transmits data generated in synchronization with the clock to the receiving device. The receiving device comprises a receiving unit, a detecting unit, a storage unit, and a calculating unit. The receiving unit receives the data. The detecting unit detects the clock frequency from the data. The storage unit stores temperature characteristic information regarding the temperature characteristic of the clock frequency. The calculating unit calculates a temperature corresponding to the clock frequency based on the clock frequency and the temperature characteristic information.

34 Claims, 8 Drawing Sheets

| PREAMBLE PATTERN | UW | SENSOR DATA | CLOCK CIRCUIT CHARACTERISTIC VALUE |

DATA COMMUNICATION SYSTEM AND RECEIVING DEVICE

BACKGROUND OF THE INVENTION

1. Field of the Invention

The present invention relates to a data communication system having a transmitting device which transmits data and a receiving device which receives the data from the transmitting device.

Priority is claimed on Japanese Patent Application No. 2009-047943, filed Mar. 2, 2009, the content of which is incorporated herein by reference.

2. Description of Related Art

As a method of detecting the temperature of an environment in which a device is installed, there has been proposed a method of detecting the temperature of an image sensor by integrating dark current noise of the image sensor and calculating the environmental temperature from the detection result in Japanese Patent Publication No. 3954382.

SUMMARY OF THE INVENTION

In one aspect of the present invention, there is provided a data communication system that includes at least: a transmitting device which transmits data and a receiving device which receives the data, wherein the transmitting device comprises: a clock generating circuit which generates a clock having a temperature characteristic in that a clock frequency varies with temperature; and a transmitting unit which transmits data generated in synchronization with the clock to the receiving device; and wherein the receiving device comprises: a receiving unit which receives the data transmitted from the transmitting device; a detecting unit which detects the clock frequency from the data received by the receiving unit; a storage unit which stores temperature characteristic information regarding the temperature characteristic of the clock frequency; and a calculating unit which calculates a temperature corresponding to the clock frequency based on the clock frequency detected by the detecting unit and the temperature characteristic information stored in the storage unit.

Preferably, the temperature characteristic information may be a representative temperature characteristic value of the clock generating circuit.

Preferably, the receiving device may further comprise a selecting unit which selects one piece of temperature characteristic information from a plurality of pieces of the temperature characteristic information based on the data received by the receiving unit.

Preferably, the data transmitted from the transmitting device may include identification information used to identify the temperature characteristic in the clock generating circuit and the selecting unit may select the temperature characteristic information based on the identification information.

Preferably, the receiving unit may further receive the temperature characteristic information from an external device and the storage unit may store the temperature characteristic information received by the receiving unit.

Preferably, the transmitting unit may further transmit the temperature characteristic information, the receiving unit may further receive the temperature characteristic information from the transmitting device, and the storage unit may store the temperature characteristic information received by the receiving unit.

Preferably, the clock generating circuit may be arranged in the vicinity of an outer wall of the transmitting device.

Preferably, the transmitting device may further comprise a sensor which detects an environment around the transmitting device, and the clock generating circuit may be arranged in the vicinity of the sensor.

Preferably, the sensor may be an imager.

Preferably, the sensor may be a PH sensor.

Preferably, the receiving unit may include at least: a first receiving circuit which receives the data transmitted from the transmitting device; and a second receiving circuit which receives the temperature characteristic information transmitted from the external device.

Preferably, the data transmitted from the transmitting device may include a sync pattern periodically inserted into the data, and the detecting unit may detect the clock frequency from the sync pattern included in the data received by the receiving unit.

Preferably, the detecting unit may detect the clock frequency by measuring a timing of the sync pattern included in the data received by the receiving unit, detecting a frequency difference between the clock of the transmitting device and a reception clock of the receiving device, and adding the frequency difference to a frequency of the reception clock.

Preferably, the data transmitted from the transmitting device may include a preamble pattern, and the detecting unit may detect the clock frequency from the preamble pattern included in the data received by the receiving unit.

Moreover, in another aspect of the present invention, there is provided a receiving device that includes at least: a receiving unit which receives data generated in synchronization with a clock having a temperature characteristic in that a clock frequency varies with temperature; a detecting unit which detects the clock frequency from the data received by the receiving unit; a storage unit which stores temperature characteristic information regarding the temperature characteristic of the clock frequency; and a calculating unit which calculates the temperature corresponding to the clock frequency based on the clock frequency detected by the detecting unit and the temperature characteristic information stored in the storage unit.

BRIEF DESCRIPTION OF THE DRAWINGS

The above features and advantages of the present invention will be more apparent from the following detailed description of certain preferred embodiments taken in conjunction with the accompanying drawings, in which.

DETAILED DESCRIPTION OF THE PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the drawings.

First Embodiment

First, a first embodiment of the present invention will be described. In this embodiment, an example in which the present invention has been applied to an electronic camera system having a transmitting device which wirelessly transmits image data obtained from an image sensor as transmission data and a receiving device which receives the transmitted data from the transmitting device and reproduces and records the image data from the transmitted data will be described.

Figure 1:
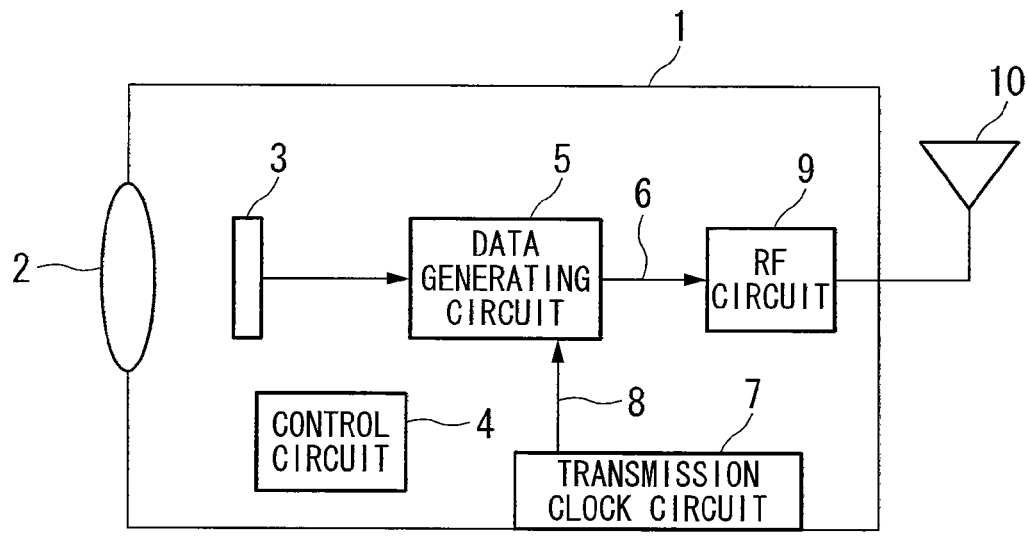
FIG. 1 is a block diagram showing the configuration of a transmitting device according to a first embodiment of the present invention.

FIG. 1 shows the configuration of the transmitting device according to this embodiment. In the transmitting device 1, a lens 2 forms an image of an object on an imaging device 3. The imaging device 3 captures the object image formed by the lens 2 and outputs image data. A data generating circuit 5 generates transmission data 6 using the image data from the imaging device 3 and unique information set for each transmitting device. Details of the unique information will be described later. An RF circuit 9 high-frequency modulates the transmission data 6 and transmits the modulated data from an antenna 10 to the receiving device.

Various types of control of the transmitting device 1 are performed by a control circuit 4 and a transmission mode or the like is set. A transmission clock circuit 7 generates a transmission clock signal 8. The transmission clock signal 8 is provided from the transmission clock circuit 7 to a data generating circuit 5. The transmission data 6 is generated at a timing synchronized with the transmission clock signal 8. The transmission clock circuit 7 is arranged in the vicinity of an outer wall (or in contact with the outer wall) of the transmitting device 1. The transmitting device 1 is constituted so the temperature of an oscillator within the transmission clock circuit 7 reflects a change in the ambient temperature of the transmitting device 1 through the outer wall.

In this embodiment, an example in which the frequency of the transmission clock signal 8 is set to 10 MHz and a 1-bit period of the transmission data 6 is constituted by 10 clocks of the transmission clock signal 8 will be described. In this case, the transmission rate of the transmission data 6 becomes 1 Mbps.

Figure 2:
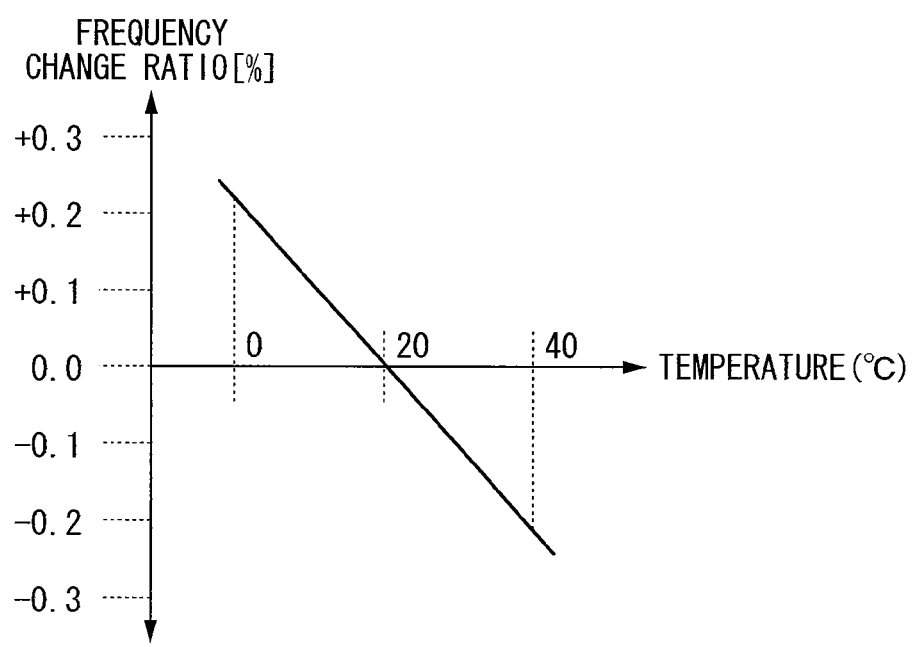
FIG. 2 is a reference diagram showing temperature characteristics of a transmission clock circuit according to the first embodiment of the present invention.

FIG. 2 shows temperature characteristics (temperature to frequency change characteristics) of the transmission clock circuit 7. The temperature characteristics show the frequency change of the transmission clock signal 8 generated by the transmission clock circuit 7 to the temperature. In this embodiment, the transmission clock circuit 7 uses a ceramic oscillator as an oscillator. As shown in FIG. 2, a frequency change of about 0.2% is generated by a temperature change of 20° C.

In this case, the frequency (transmission clock frequency) of the transmission clock signal 8 is changed by about 100 ppm due to a temperature change of 1° C. In this embodiment, a frequency change of 1,000 Hz is made by a temperature change of 1° C. since the transmission clock frequency is 10 MHz.

Figure 3:
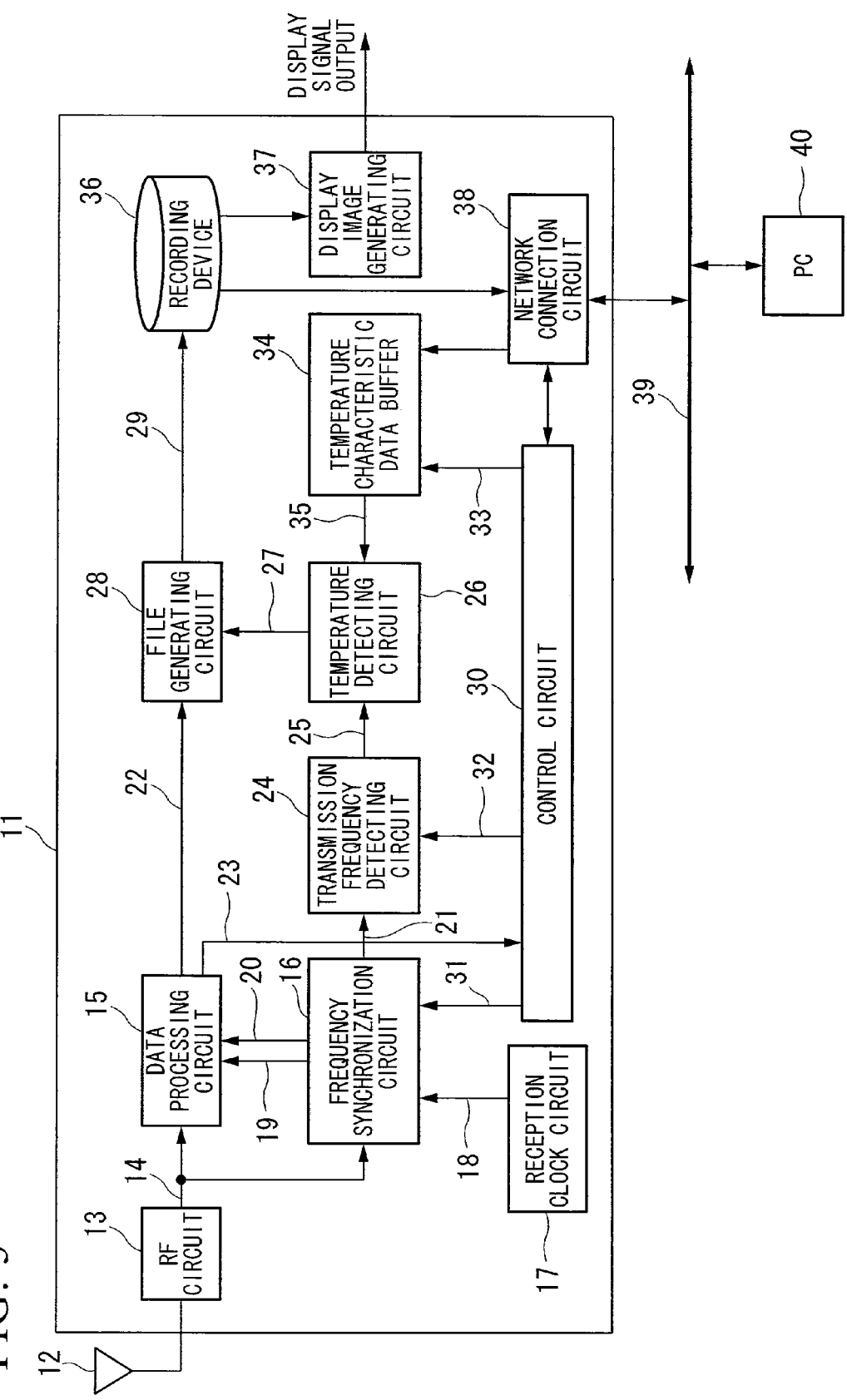
FIG. 3 is a block diagram showing the configuration of a receiving device according to the first embodiment of the present invention.

FIG. 3 shows the configuration of the receiving device according to this embodiment. In a receiving device 11, an RF circuit 13 receives an RF signal from the transmitting device 1 by an antenna 12, demodulates the RF signal, and generates a received signal 14. The received signal 14 is provided to a data processing circuit 15 and a frequency synchronization circuit 16.

The data processing circuit 15 is a circuit which reproduces image data 22 and unique information 23 from the received signal 14. The frequency synchronization circuit 16 is a circuit which generates a sync pattern detection signal 19 indicating a sync pattern detection timing, a reproduction clock signal 20 synchronized with the frequency and phase of the transmission clock signal 8, and a frequency difference signal 21 indicating the frequency difference between the transmission clock signal 8 and a reception clock signal 18 from the received signal 14. The electronic camera system of this embodiment has a plurality of transmission modes and the frequency synchronization circuit 16 changes an operation in response to each transmission mode.

A control circuit 30 is a circuit which controls the operation of the receiving device 11. A transmission mode selection signal 31 indicating the transmission mode is output from the control circuit 30 to the frequency synchronization circuit 16. Details of the operation of the frequency synchronization circuit 16 corresponding to the transmission mode will be described later. The reproduction clock signal 20 is provided to the data processing circuit 15 and is used to reproduce the received signal 14.

The frequency difference signal 21 is provided to a transmission frequency detecting circuit 24. The transmission frequency detecting circuit 24 generates transmission clock frequency data 25 indicating the frequency of the transmission clock signal 8 from the frequency difference signal 21 and reception clock frequency data 32 and outputs the generated data to a temperature detecting circuit 26. The reception clock frequency data 32 is data indicating the frequency of the reception clock signal 18, and is output from the control circuit 30 to the transmission frequency detecting circuit 24.

As described above, the frequency difference signal 21 indicates the frequency difference between the transmission clock signal 8 and the reception clock signal 18. Since the reception clock frequency data 32 indicates the frequency of the reception clock signal 18, the transmission clock frequency data 25 indicating the frequency of the transmission clock signal 8 is obtained by adding the frequency difference signal 21 to the reception clock frequency data 32.

The transmission clock frequency data 25 is output from the transmission frequency detecting circuit 24 to the temperature detecting circuit 26, and temperature characteristic data 35 is output from a temperature characteristic data buffer 34. The temperature characteristic data 35 is data indicating characteristics of a transmission clock frequency to the temperature in the transmitting device 1. The temperature detecting circuit 26 generates temperature data 27 indicating the temperature of the transmission clock circuit 7 using the transmission clock frequency data 25 and the temperature characteristic data 35, and outputs the generated data to a file generating circuit 28.

The control circuit 30 generates a temperature characteristic data selection signal 33 corresponding to characteristics of the transmission clock circuit 7 of the transmitting device 1 based on unique information 23 from the data processing circuit 15, and outputs the generated signal to the temperature characteristic data buffer 34. The temperature characteristic data is stored in the temperature characteristic data buffer 34. The temperature characteristic data selection signal 33 is provided from the control circuit 30 to the temperature characteristic data buffer 34. The temperature characteristic data 35 selected in response to the temperature characteristic data selection signal 33 is output from the temperature characteristic data buffer 34.

By the above-described operation, the temperature characteristic data 35 corresponding to characteristics of the transmitting device 1 indicated by the unique information 23 of the received signal 14 is provided to the temperature detecting circuit 26. When no temperature characteristic data 35 corresponding to the characteristics of the transmitting device 1 is present in the temperature characteristic data buffer 34, the control circuit 30 downloads the temperature characteristic data stored in a PC (Personal Computer) 40 as an external device on a network 39 via a network connection circuit 38 and stores the downloaded data in the temperature characteristic data buffer 34. Thus, the receiving device 11 can use the temperature characteristic data downloaded from the PC 40 as well as its own pre-stored temperature characteristic data.

The temperature data 27 from the temperature detecting circuit 26 is provided to the file generating circuit 28 along with the image data 22 from the data processing circuit 15. The file generating circuit 28 converts the image data 22 and the temperature data 27 into file data 29 and outputs the file data 29 to a recording device 36. The file data 29 is recorded to the recording device 36. The file data on the recording device 36 is converted into a display signal by a display image generating circuit 37, and is displayed by an external display section. The temperature data 27 is also displayed on the display screen. The file data 29 can also be transmitted to a device on the network 39 via the network connection circuit 38.

Figure 4:
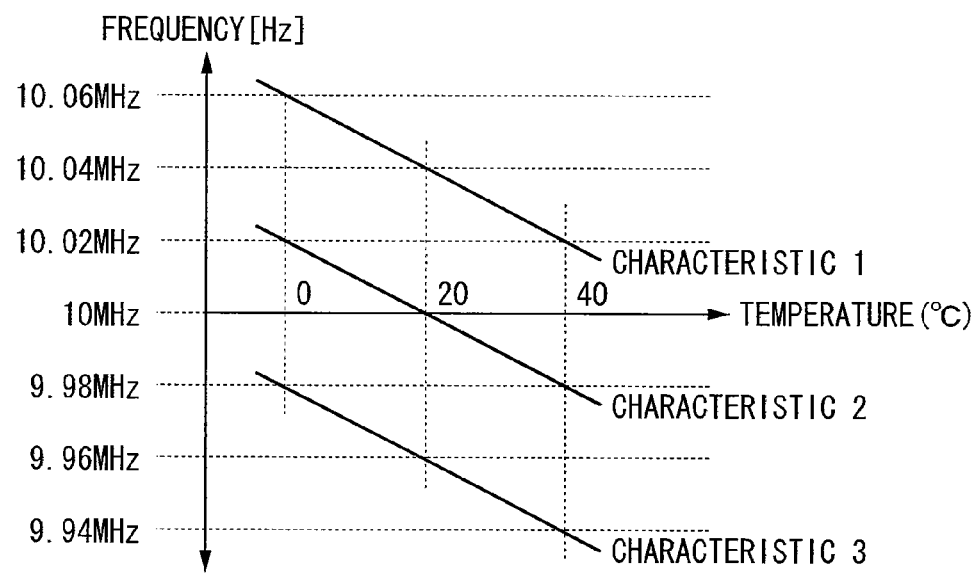
FIG. 4 is a reference diagram showing temperature characteristic data according to the first embodiment of the present invention.

FIG. 4 is an example of temperature characteristic data stored in the temperature characteristic data buffer 34. In this embodiment, an example in which three types of temperature characteristic data of a characteristic 1, a characteristic 2, and a characteristic 3 will be described. The characteristics 1, 2, and 3 are respectively expressed by a set of a plurality of "temperature-to-frequency" data.

In this embodiment, it is described that the ceramic oscillator of the transmission clock circuit 7 has a frequency change characteristic of about 100 ppm/° C. as described above, and a unique frequency change of the oscillator is large. In this case, the temperature characteristic data becomes a set of data having characteristics that the slope of the frequency change is substantially the same and the unique frequency varies as shown in FIG. 4. The unique information 23 is information capable of identifying one of the characteristics 1, 2, and 3.

Various methods as well as the above-described method are possible as a method of associating the temperature characteristics of the transmitting device 1 with unique information. For example, a configuration method can be taken to use a value measured in advance for every individual device as temperature characteristic data using an identification ID for each transmitting device as unique information. As another method, it is possible to take a method in which the receiving device 11 generates temperature characteristic data from frequency data and a slope of the frequency change at 0° C. using frequency data at 0° C. as unique information by setting the same slope of the frequency change in the temperature characteristics in any transmitting device.

A method in which the frequency synchronization circuit 16 generates the frequency difference signal 21 will be described using FIGS. 5 to 8.

Figure 5:
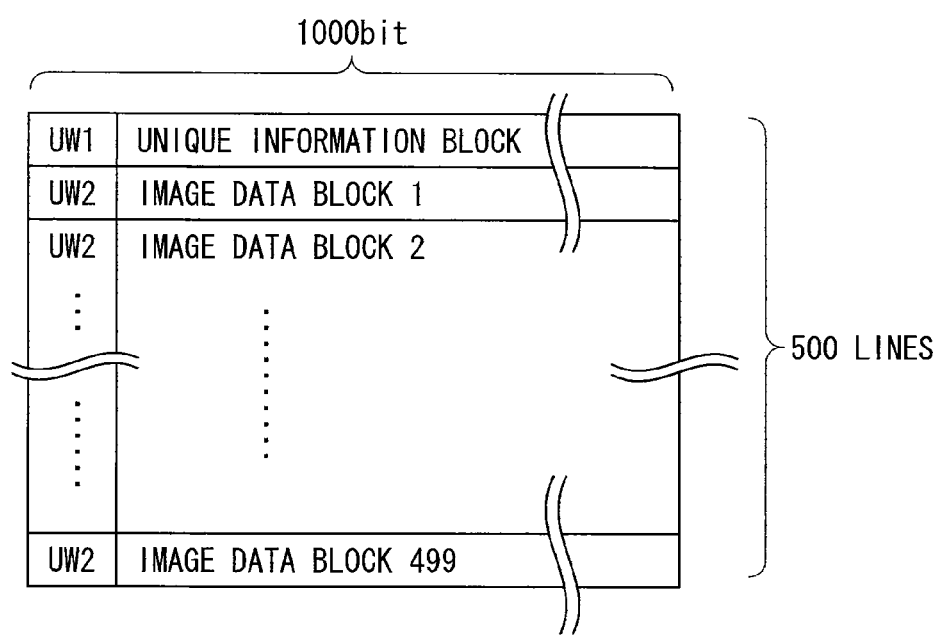
FIG. 5 is a reference diagram showing the configuration of a frame of transmission data according to the first embodiment of the present invention.

FIG. 5 shows the configuration of 1 frame of the transmission data 6 according to this embodiment. As shown in FIG. 5, image data is divided into a plurality of data blocks in a predetermined unit. A sync pattern (UW: Unique Word) is added to the head of each block. The UW is data configured by a sync pattern which is not generated in image data.

In this embodiment, UW1 indicates the head of a frame, and UW2 indicates the head of an image data block. Unique information of the transmitting device 1 is arranged after UW1. As shown in FIG. 5, the total amount of data is 500,000 bits since 1 frame includes 500 lines and 1 line is 1,000 bits. As described above, the transmission time of 1 frame becomes 0.5 sec since the transmission rate is 1 Mbps.

Figure 6:
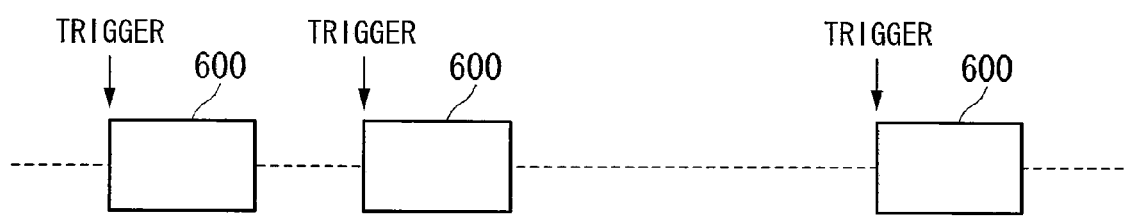
FIG. 6 is a reference diagram showing a transmission mode according to the first embodiment of the present invention.
Figure 7:
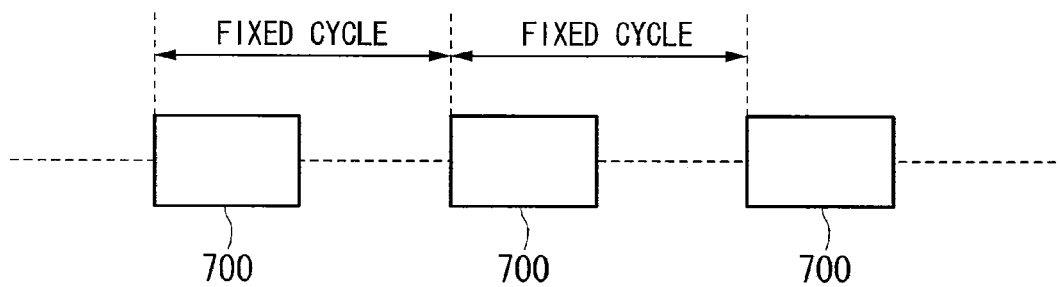
FIG. 7 is a reference diagram showing a transmission mode according to the first embodiment of the present invention.

The transmission mode will be described using FIGS. 6 and 7. In this embodiment, the transmission mode includes two types of a first transmission mode (FIG. 6) in which transmission data 600 is transmitted in response to a trigger signal discontinuously generated and a second transmission mode (FIG. 7) in which transmission data 700 is continuously transmitted in a fixed cycle. The trigger signal is a signal generated by the control circuit 4 (not shown). The transmission mode and the trigger are set by the control circuit 4.

For example, the first transmission mode is a mode in which the trigger signal is generated in response to a shutter trigger timing instructed from the receiving device 11. In the first transmission mode, the transmission of the transmission data 6 from the transmitting device 1 is discontinuously performed in response to a trigger.

For example, the second transmission mode is a mode in which the receiving device 11 generates a trigger signal in a predetermined cycle. In the second transmission mode, the transmission data 6 from the transmitting device 1 is periodically transmitted. As described above, the transmission cycle is at least 0.5 sec since the transmission time of 1 frame is 0.5 sec. In this embodiment, the transmission cycle is assumed to be 1 sec.

Figure 8:
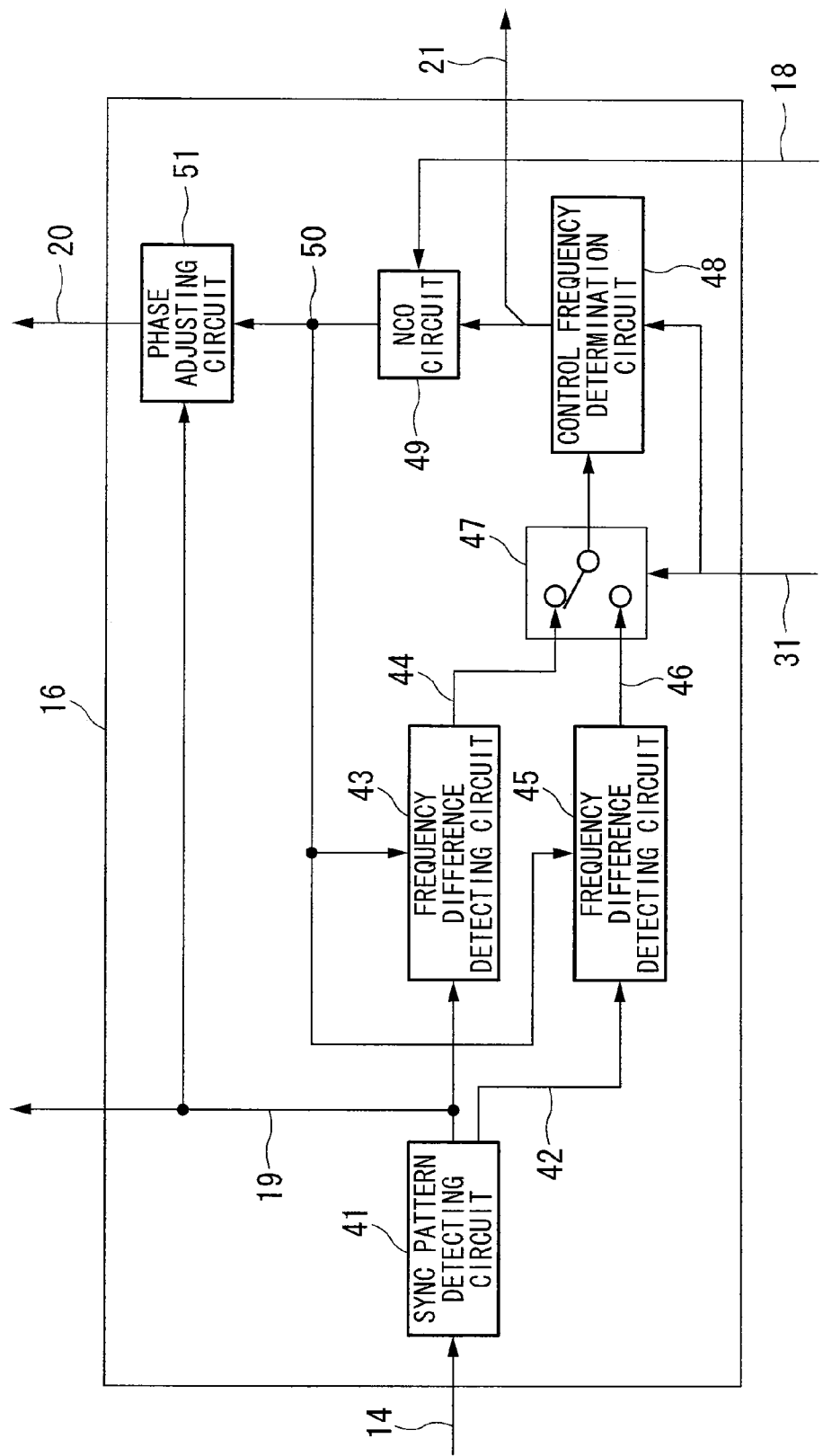
FIG. 8 is a block diagram showing the configuration of a frequency synchronization circuit provided in the receiving device according to the first embodiment of the present invention.

FIG. 8 shows the configuration of the frequency synchronization circuit 16. A method of generating the frequency difference signal 21 in the first transmission mode and the second transmission mode will be described using FIG. 8. First, a method of generating the frequency difference signal 21 in the first transmission mode will be described.

The received signal 14 provided to the frequency synchronization circuit 16 is provided to a sync pattern detecting circuit 41.

The sync pattern detecting circuit 41 detects a sync pattern of communication data by a correlation calculation. When the communication data has completely matched the sync pattern by the correlation calculation, the sync pattern detection signal 19 becomes "1" (HI). The sync pattern detection signal 19 from the sync pattern detecting circuit 41 is output to the data processing circuit 15, a frequency difference detecting circuit 43, and a phase adjusting circuit 51. A sync pattern detection signal 42 from the sync pattern detecting circuit 41 is output to a frequency difference detecting circuit 45. The sync pattern detection signal 19 is a signal indicating the detection timing of UW1 and UW2 shown in FIG. 5. The sync pattern detection signal 42 is a signal indicating the detection timing of only UW1.

An NCO (Numerical Controlled Oscillator) circuit 49 is a circuit in which the frequency of an output signal is controlled by the frequency difference signal 21 as the output of a control frequency determination circuit 48. The NCO circuit 49 operates based on the reception clock signal 18. The frequency of an NCO output signal 50 is controlled to be the same as the transmission clock frequency by the frequency difference signal 21.

In this embodiment, the NCO circuit 49 generates an internal clock by internally multiplying the reception clock signal 18 by 10, executes an accumulative addition process in response to a value of the frequency difference signal 21 at the timing of the internal clock, and outputs the most significant bit of the processing result as the NCO output signal 50. Details of the NCO circuit are well known and therefore description thereof is omitted.

A phase of the NCO output signal 50 is adjusted by the phase adjusting circuit 51 and the NCO output signal 50 is output as the reproduction clock signal 20. The phase adjusting circuit 51 is a circuit which adjusts the phase of the reproduction clock signal 20 using the detection timing of sync patterns UW1 and UW2 indicated by the sync pattern detection signal 19. Since a phase adjustment technique by the phase adjusting circuit 51 is well known, description thereof is omitted.

In the first transmission mode, an output signal 44 of the frequency difference detecting circuit 43 is selected by a selector 47 and is output to a control frequency determination circuit 48. The control frequency determination circuit 48 is a circuit which determines an output value of the frequency difference detecting circuit 43 or the frequency difference detecting circuit 45 selected by the selector 47 and an output value of the next timing from the output value (the frequency difference signal 21) at the time. Specifically, the control frequency determination circuit 48 determines an output value of the next time by subtracting the output value of the frequency difference detecting circuit 43 or the frequency difference detecting circuit 45 from an output value of the current time.

The frequency difference signal 21 is output to the NCO circuit 49 within the frequency synchronization circuit 16 and the transmission frequency detecting circuit 24. The frequency difference detecting circuit 43 is a circuit which detects the difference between the transmission clock frequency and the frequency of the NCO output signal 50 by measuring the detection timing of the sync pattern detection signal 19 within a 1-frame period using the NCO output signal 50.

The output signal 44 of the frequency difference detecting circuit 43 is output to the control frequency determination circuit 48 through the selector 47 as described above. The control frequency determination circuit 48 determines the frequency difference signal 21 so that the output signal 44 of the frequency difference detecting circuit 43 is small. By the above-described operation, the frequency difference signal 21 becomes a signal indicating a difference between the frequency of the reception clock signal 18 and the frequency of the transmission clock signal 8.

A numerical example for the frequency difference signal 21 will be described. It is assumed that the frequency (reception clock frequency) of the reception clock signal 18 is 10 MHz and the transmission clock frequency is 10.01 MHz shifted from the reception clock frequency by +1,000 ppm. As described above, a 1-bit period of the transmission data is constituted by a period of 10 reception clocks. As shown in FIG. 5, 1 line (UW1+Unique Information Block or UW2+Image Data Block) corresponds to 10,000 clocks.

The frequency difference detecting circuit 43 measures the frequency difference between the transmission clock signal and the reception clock signal by performing measurement in a UW detection period set for every 100 lines. In the case where the transmission clock frequency is not different from the frequency of the NCO output signal 50 when a period until UW2 after 100 lines is detected after the detection of UW1 is counted by the NCO output signal 50, a value of 1,000,000 is counted since 1 line corresponds to 10,000 clocks. When the transmission clock frequency is 10.01 MHz and the NCO output signal 50 is the same 10 MHz as the reception clock signal 18, a value of 999,900 is counted. In this case, an output of the frequency difference detecting circuit 43 becomes "100".

In this case, the next value of the frequency difference signal 21 as the output of the control frequency detecting circuit 48 becomes "100" by adding "100" to the current output value "0". When the frequency difference signal 21 is "100", the output frequency of the NCO circuit 49 becomes 10.01 MHz. After the measurement of the frequency difference by the detection of UW1 and UW2 after 100 lines, UW2 after 100 lines is further detected and the above-described frequency difference is repeatedly measured during the reception of transmission data. In the next measurement, the output of the frequency difference detecting circuit 43 becomes "0" and the frequency difference signal 21 becomes "100". These values are stabilized in the subsequent measurement.

Next, a method of generating the frequency difference signal 21 in the second transmission mode will be described. In the second transmission mode, the transmission data is periodically transmitted as shown in FIG. 7. In the second transmission mode, an output signal 46 of the frequency difference detecting circuit 45 is selected by the selector 47 and is output to the control frequency determination circuit 48. In the case where the transmission clock frequency is not different from the frequency of the NCO output signal 50 when a detection interval of UW1 is counted by the NCO output signal 50, the transmission cycle becomes 1 sec and therefore a value of 10,000,000 is counted (since 10 MHz is counted during 1 sec). Since description other than the above is the same as in the first transmission mode, it is omitted.

According to this embodiment as described above, the temperature of the transmission clock circuit 7 can be detected by generating the transmission clock frequency data 25 from the received signal 14 corresponding to the transmission data 6 generated in synchronization with the transmission clock signal 8 and calculating the temperature corresponding to the transmission clock frequency based on the transmission clock frequency data 25 and the temperature characteristic data 35. A circuit for measuring a dark current of many pixels as in the related art is unnecessary and an increase in a circuit size can be suppressed.

A more exact temperature can be detected by preparing in advance a plurality of temperature characteristic data and constituting the receiving device 11 to employ the temperature characteristic data 35 corresponding to temperature characteristics of the transmitting device 1 based on the unique information 23 obtained from the received signal 14.

It is not necessary to prepare in advance all of the temperature characteristic data at the side of the receiving device 11 by constituting the receiving device 11 to download the temperature characteristic data from the PC 40 as necessary.

An ambient temperature of the transmitting device 1 can be detected by arranging the transmission clock circuit 7 in the vicinity of the outer wall of the transmitting device 1 (or in contact with the outer wall).

As another configuration of this embodiment, there is a system in which the transmission clock circuit 7 of the transmitting device 1 is arranged in the vicinity of the imaging device 3. In this system, an image file is generated by associating temperature data with image data from the imaging device 3. Thus, it is possible to sense the temperature of the imaging device 3. The receiving device 11 can effectively correct a pixel fault of the imaging device 3 in response to the temperature. It is possible to detect the temperature of the sensor by arranging the transmission clock circuit 7 in the vicinity of the sensor. The output of the sensor having temperature characteristics can be corrected.

Second Embodiment

Next, a second embodiment of the present invention will be described. In this embodiment, an example in which the present invention has been applied to a sensor system having a transmitting device which wirelessly transmits PH data obtained from a PH sensor as transmission data and a receiving device which receives the transmitted data from the transmitting device and reproduces and records the PH data from the transmitted data will be described.

Figures 9, 10:
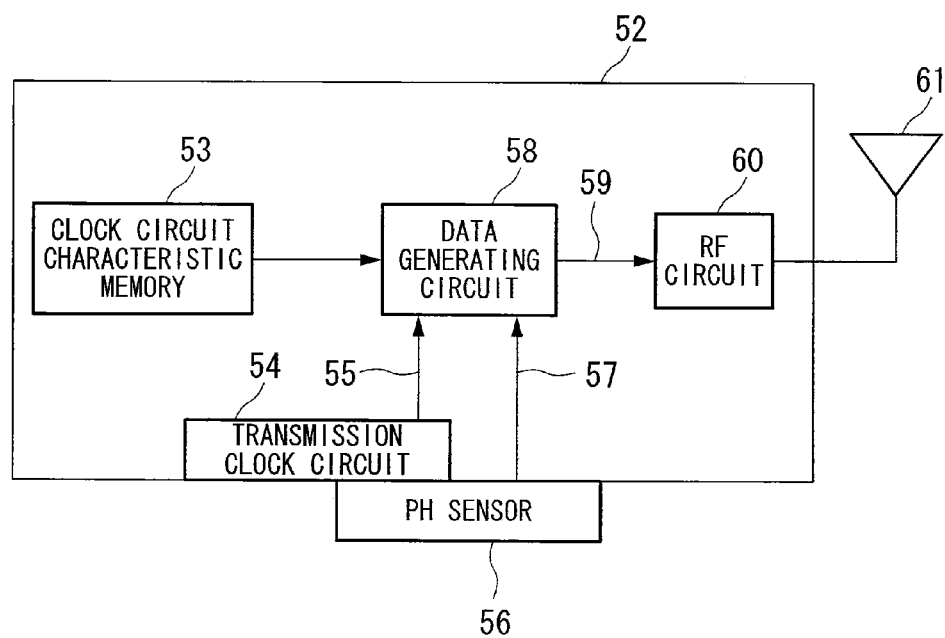
FIG. 9 is a block diagram showing the configuration of a transmitting device according to a second embodiment of the present invention.
FIG. 10 is a reference diagram showing the configuration of transmission data according to the second embodiment of the present invention.

FIG. 9 shows the configuration of the transmitting device according to this embodiment. In a transmitting device 52, a data generating circuit 58 generates transmission data 59 using PH data 57 obtained from a PH sensor 56 and a clock circuit characteristic value stored in a clock circuit characteristic memory 53. The clock circuit characteristic value is a value regarding a temperature characteristic of a transmission clock circuit 54 measured at the time of manufacturing the transmitting device 52.

A transmission clock signal 55 from the transmission clock circuit 54 is provided to the data generating circuit 58. The transmission data 59 is generated at the timing synchronized with the transmission clock signal 55. An RF circuit 60 high-frequency modulates the transmission data 59 and transmits the modulated data from an antenna 61 to a receiving device 62.

The transmission clock circuit 54 is arranged in the vicinity of the PH sensor 56 and the temperature of the transmission clock circuit 54 becomes substantially the same as the temperature of the PH sensor 56. The transmission clock circuit 54 is constituted by a circuit adopting a crystal oscillator. In this embodiment, it is described that the transmission clock frequency is 10 MHz and the frequency change characteristic is 1 ppm/° C. (a change of 10 Hz by a change of 1° C.). Also in this embodiment like the first embodiment, it is described that a 1-bit period of the transmission data 59 is constituted by 10 clocks of the transmission clock signal 55.

FIG. 10 shows the configuration of the transmission data 59 according to this embodiment. In this embodiment, the transmission data is intermittently transmitted in a long period and a preamble pattern to be used for frequency synchronization is added to the head thereof. It is possible to detect the transmission clock frequency from the preamble pattern. After the preamble pattern, a sync pattern (UW), sensor data, and a clock circuit characteristic value are arranged in this order.

Figure 11:
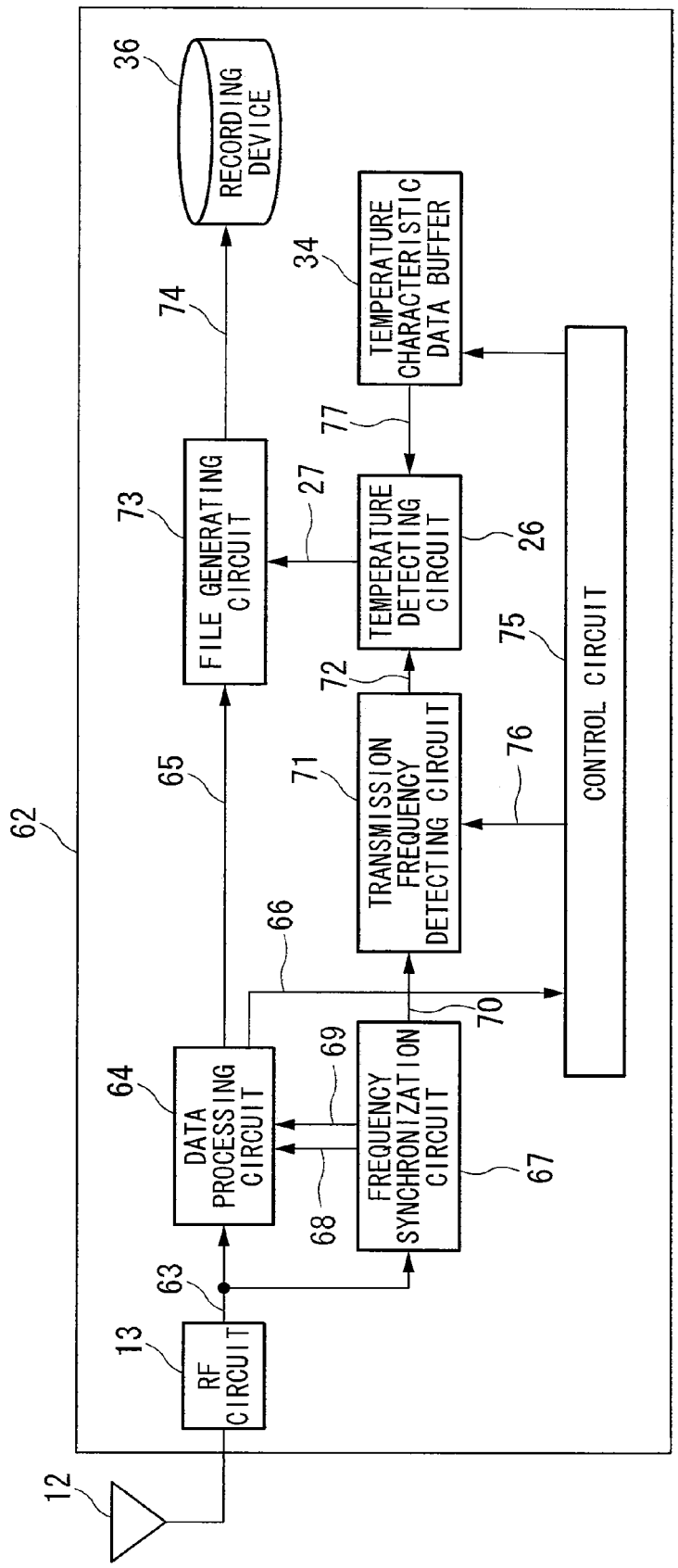
FIG. 11 is a block diagram showing the configuration of a receiving device according to the second embodiment of the present invention.

FIG. 11 shows the configuration of the receiving device 62 according to this embodiment. In FIG. 11, the same functional blocks as the blocks shown in FIG. 3 described in the first embodiment are denoted by the same reference numerals. An RF circuit 13 receives an RF signal from the transmitting device 52 by an antenna 12, demodulates the RF signal, and generates a received signal 63. The received signal 63 is provided to a data processing circuit 64 and a frequency synchronization circuit 67.

The data processing circuit 64 is a circuit which reproduces sensor data 65 and a clock circuit characteristic value 66 from the received signal 63. The frequency synchronization circuit 67 is a circuit which generates a UW timing signal 68 indicating the detection timing of UW, a reproduction clock signal 69 synchronized with the frequency and phase of the transmission clock signal 55, and a frequency signal 70 indicating the frequency of the transmission clock signal 55 from the received signal 63.

The frequency signal 70 from the frequency synchronization circuit 67 is provided to a transmission frequency detecting circuit 71 and is used to detect the frequency of the transmission clock signal 55. A detailed configuration of the frequency synchronization circuit 67 will be described later. A VCXO (Voltage Controlled Crystal Oscillator) is embedded in the frequency synchronization circuit 67 and an oscillation frequency of the VCXO is set by a frequency control voltage applied from an outside source. The UW timing signal 68 and the reproduction clock signal 69 from the frequency synchronization circuit 67 is provided to the data processing circuit 64 and is used to reproduce the received signal 63.

The transmission frequency detecting circuit 71 generates transmission clock frequency data 72 indicating the frequency of the transmission clock signal 55 using VCXO oscillation frequency data 76 set by a control circuit 75 and the frequency signal 70, and outputs the transmission clock frequency data 72 to a temperature detecting circuit 26. The transmission clock frequency data 72 is output from the transmission frequency detecting circuit 71 to the temperature detecting circuit 26, and temperature characteristic data 77 generated by the control circuit 75 in response to the clock circuit characteristic value 66 is output from a temperature characteristic data buffer 34.

As described above, the clock circuit characteristic value is a value regarding a temperature characteristic of the transmission clock circuit 54. For example, the clock circuit characteristic value is a value of a feature point determining temperature characteristic data shown in FIG. 4 (the frequency value at a specific temperature of 0° C. or the like). For example, the control circuit 75 internally stores a slope of temperature characteristic data shown in FIG. 4 as a value indicating a temperature characteristic of the transmission clock circuit 54, generates the temperature characteristic data shown in FIG. 4 from the slope and a value of a feature point indicated by the clock circuit characteristic value, and outputs the generated data to the temperature characteristic data buffer 34. Alternatively, the clock circuit characteristic value may include values of both a feature point and a slope and the control circuit 75 may generate temperature characteristic data from the feature point and the slope included in the clock circuit characteristic value.

The temperature characteristic data as the temperature characteristic data 77 is output from the temperature characteristic data buffer 34 to the temperature detecting circuit 26.

The temperature detecting circuit 26 generates temperature data 27 indicating the temperature of the transmission clock circuit 54 using the transmission clock frequency data 72 and the temperature characteristic data 77 and outputs the generated temperature data 27 to the file generating circuit 73.

Along with the sensor data 65 reproduced by the data processing circuit 64, the temperature data 27 from the temperature detecting circuit 26 is provided to the file generating circuit 73. The file generating circuit 73 converts the sensor data 65 and the temperature data 27 into file data 74 and sends the file data 74 to a recording device 36. The file data 74 is recorded to the recording device 36.

Figure 12:
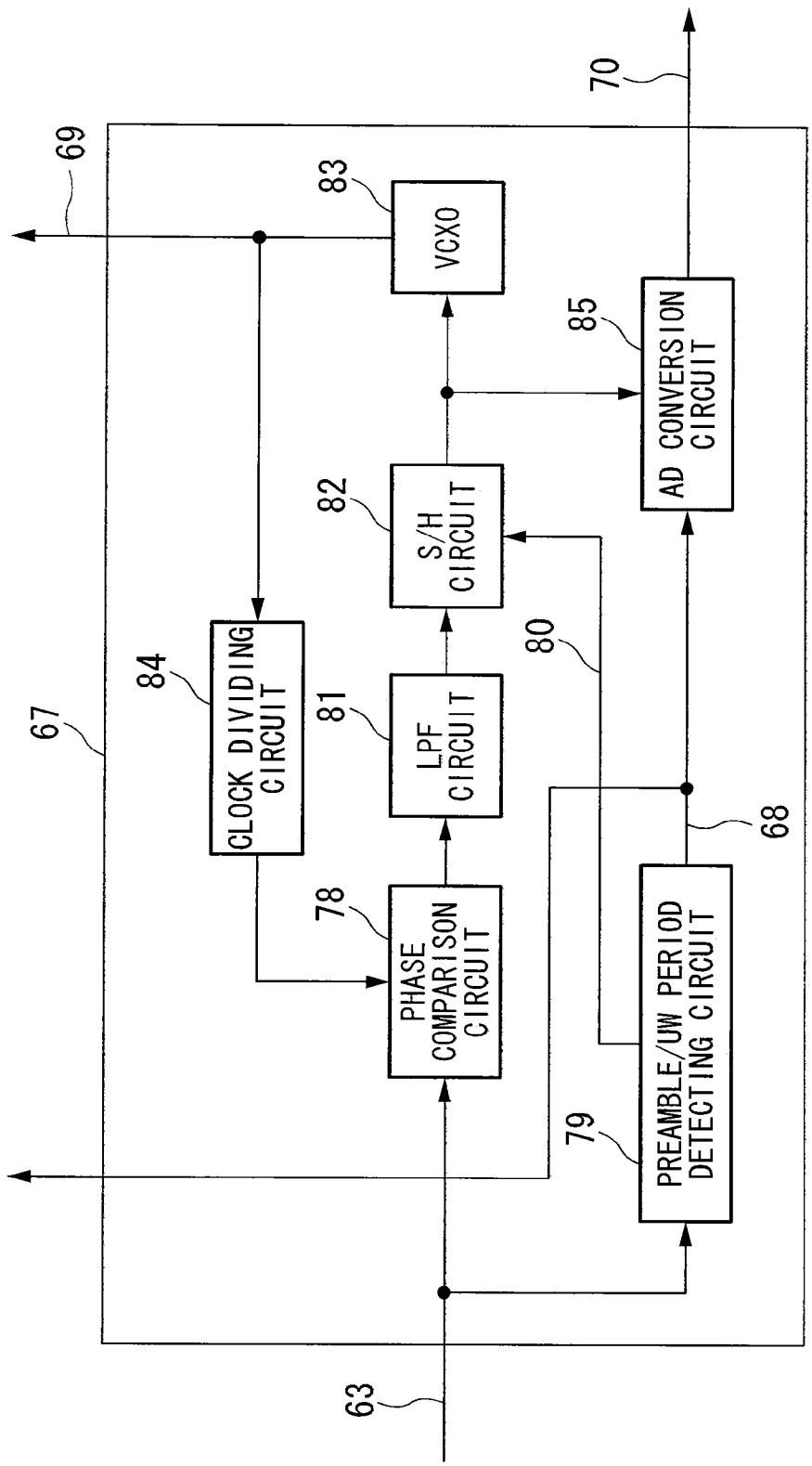
FIG. 12 is a block diagram showing the configuration of a frequency synchronization circuit provided in the receiving device according to the second embodiment of the present invention.

FIG. 12 shows the configuration of the frequency synchronization circuit 67. The operation of the frequency synchronization circuit 67 will be described using FIG. 12. The received signal 63 provided to the frequency synchronization circuit 67 is input to a phase comparison circuit 78 and a preamble/UW period detecting circuit 79. The preamble/UW period detecting circuit 79 detects a preamble pattern of the transmission data 59 and a UW based on the received signal 63 and outputs a preamble period signal 80 and a sync pattern detection signal 68.

The preamble period signal 80 is a signal indicating a period in which the preamble pattern is received. The sync pattern detection signal 68 is a signal indicating a UW detection timing. Since a method of detecting a UW and a preamble is well known, description thereof is omitted.

A clock dividing circuit 84 divides the reproduction clock signal 69 as an output of a VCXO 83. A phase comparison circuit 78 generates a phase difference signal by comparing phase information of an output of the clock dividing circuit 84 with phase information of the preamble pattern of the received signal 63, and outputs the phase difference signal to an LPF circuit 81. An output of the LPF circuit 81 is provided to a frequency control terminal of the VCXO 83 through an S/H (Sample/Hold) circuit 82.

A loop of the phase comparison circuit 78, the LPF circuit 81, the S/H circuit 82, the VCXO 83, and the clock dividing circuit 84 described above constitute a well-known PLL (Phase Locked Loop) circuit. The S/H circuit 82 operates in response to the preamble period signal 80 from the preamble/UW period detecting circuit 79. Thereby, a reproduction clock signal 69 having the frequency and phase synchronized with the preamble pattern is generated. Since the synchronization operation of the above-described reproduction clock signal 69 is well known, description thereof is omitted hereinafter.

A signal output from the S/H circuit 82 is output to the VCXO 83 and an AD conversion circuit 85. The AD conversion circuit 85 performs an AD conversion operation by the UW detection signal 68. At the time of detecting the UW, the reproduction clock signal 69 is frequency-synchronized with the transmission clock signal 55 and a control voltage (an output of the S/H circuit 82) directed to the frequency control terminal of the VCXO 83 is a voltage indicating the frequency of the transmission clock signal 55. Thus, the value of the frequency signal 70 becomes a value indicating the frequency of the transmission clock signal 55.

Again using FIG. 11, the operation of the transmission frequency detecting circuit 71 will be described. The frequency signal 70 and the frequency data 76 are input to the transmission frequency detecting circuit 71. The frequency data 76 is data indicating a relationship between a control voltage and an oscillation frequency of the VCXO 83, and is set by the control circuit 75. The transmission frequency detecting circuit 71 generates the transmission clock frequency data 72 indicating the frequency of the transmission clock signal 55 from the frequency signal 70 and the frequency data 76, and outputs the generated data to the temperature detecting circuit 26. Since the subsequent process is the same as that of the first embodiment, description thereof is omitted.

Furthermore, the temperature characteristic information of the PH sensor 56 (information regarding a sensor value at a temperature) is separately recorded and the sensor data 65 is appropriately corrected using the temperature data 27. Since details of the correction using the temperature data 27 are not directly related to the present invention, description thereof is omitted.

According to this embodiment as described above, the temperature of the transmission clock circuit 54 can be detected while suppressing an increase in a circuit size by generating the transmission clock frequency data 72 from the received signal 63 corresponding to the transmission data 59 generated in synchronization with the transmission clock signal 55 and calculating the temperature corresponding to the transmission clock frequency based on the transmission clock frequency data 72 and the temperature characteristic data 77.

The transmitting device 52 includes and transmits a clock circuit characteristic value regarding a temperature characteristic of the transmission clock circuit 54 in the transmission data 59 and the receiving device 62 generates temperature characteristic data from the clock circuit characteristic value. Thereby, it is not necessary to prepare in advance temperature characteristic data corresponding to an individual transmitting device at the side of the receiving device 62.

It is possible to detect the temperature of the PH sensor 56 by arranging the transmission clock circuit 7 in the vicinity of the PH sensor 56 and correct a sensor output having temperature characteristics.

As another configuration of this embodiment, there is a system in which temperature characteristics of the transmission clock circuit 54 are not measured at the time of manufacturing the transmitting device 52. In this system, the transmitting device 52 does not send a clock circuit characteristic value regarding a temperature characteristic for each transmitting device, and the receiving device 62 holds representative temperature characteristic data and detects the temperature using the held temperature characteristic data. Thus, it is not necessary to prepare in advance temperature characteristic data corresponding to an individual transmitting device 52 at the side of the receiving device 62.

That is, according to the present invention, the temperature can be detected while suppressing an increase in a circuit size by detecting a clock frequency from data generated in synchronization with a clock having a temperature characteristic that a clock frequency varies with temperature and calculating the temperature corresponding to the clock frequency based on the detected clock frequency and temperature characteristic information regarding a temperature characteristic of the clock frequency.

While the exemplary embodiments of the invention have been described with reference to the accompanying drawings, the detailed constitutions of the invention are not limited to the foregoing embodiments but embrace changes in design to the extent that they do not depart from the concept of the invention.

What is claimed is:

1. A data communication system comprising a transmitting device which transmits data and a receiving device which receives the data, wherein the transmitting device comprises:
a transmission clock generating circuit which generates a clock having a temperature characteristic in that a clock frequency varies with temperature; and
a transmitting unit which wirelessly transmits data generated in synchronization with the clock to the receiving device, and
wherein the receiving device comprises:
a receiving unit which receives the data wirelessly-transmitted from the transmitting device;
a reception clock generating circuit which generates a clock;
a detecting unit comprising a frequency synchronization circuit which detects a frequency difference between the transmission clock frequency of the transmitting device and the reception clock frequency of the receiving device by using the reception clock frequency and the data wirelessly-received by the receiving unit wherein the transmission clock frequency is the frequency of the clock generated by the transmission clock generating circuit and the reception clock frequency is the frequency of the clock generated by the reception clock generating circuit;
a storage unit which stores temperature characteristic information regarding the temperature characteristic of the transmission clock generating circuit; and
a calculating unit which calculates a temperature of the transmitting device based on the frequency difference detected by the detecting unit and the temperature characteristic information stored in the storage unit.

2. The data communication system according to claim 1, wherein the storage unit stores the temperature characteristic information indicating a relation of the temperature of the transmission clock generating circuit with the transmission clock frequency obtained from the frequency difference and the reception clock frequency.

3. The data communication system according to claim 2, wherein the detecting unit further comprises a transmission frequency detecting circuit which detects the transmission clock frequency from the frequency difference and the reception clock frequency.

4. The data communication system according to claim 1, wherein the frequency synchronization circuit generates a first clock signal synchronized with the transmission clock frequency based on the data wirelessly-received by the receiving unit and the clock generated by the reception clock generating circuit, and detects the frequency difference by detecting a difference between the frequency of the first clock signal and the reception clock frequency.

5. The data communication system according to claim 4, wherein the data wirelessly-transmitted from the transmitting device includes a sync pattern periodically inserted into the data, and
the frequency synchronization circuit generates the first clock signal based on the sync pattern included in the data wirelessly-received by the receiving unit and the clock generated by the reception clock generating circuit.

6. The data communication system according to claim 4, wherein the data wirelessly-transmitted from the transmitting device includes a preamble pattern, and
the frequency synchronization circuit generates the first clock signal based on the preamble pattern included in the data wirelessly-received by the receiving unit and the clock generated by the reception clock generating circuit.

7. The data communication system according to claim 1, wherein the temperature characteristic information is a representative temperature characteristic value of the transmission clock generating circuit.

8. The data communication system according to claim 1, wherein the receiving device further comprises a selecting unit which selects one piece of temperature characteristic information from a plurality of pieces of the temperature characteristic information based on the data wirelessly-received by the receiving unit.

9. The data communication system according to claim 8, wherein the data wirelessly-transmitted from the transmitting device includes identification information used to identify the temperature characteristic information, and
the selecting unit selects the temperature characteristic information based on the identification information.

10. The data communication system according to claim 1, wherein the receiving unit further receives the temperature characteristic information from an external device, and
the storage unit stores the temperature characteristic information received by the receiving unit.

11. The data communication system according to claim 1, wherein the transmitting unit further transmits the temperature characteristic information,
the receiving unit further receives the temperature characteristic information from the transmitting device, and
the storage unit stores the temperature characteristic information received by the receiving unit.

12. The data communication system according to claim 1, wherein the transmission clock generating circuit is arranged in the vicinity of an outer wall of the transmitting device.

13. The data communication system according to claim 1, wherein the transmitting device further comprises a sensor which detects an environment around the transmitting device, and
the transmission clock generating circuit is arranged in the vicinity of the sensor.

14. The data communication system according to claim 13, wherein the sensor is an imager.

15. The data communication system according to claim 13, wherein the sensor is a PH sensor.

16. The data communication system according to claim 10, wherein the receiving unit comprises:
a first receiving circuit which wirelessly-receives the data wirelessly-transmitted from the transmitting device; and
a second receiving circuit which receives the temperature characteristic information transmitted from the external device.

17. The data communication system according to claim 1, wherein the data wirelessly-transmitted from the transmitting device includes a sync pattern periodically inserted into the data, and
the frequency synchronization circuit detects the frequency difference from the sync pattern included in the data received by the receiving unit.

18. The data communication system according to claim 17, wherein the frequency synchronization circuit detects the frequency difference by measuring a timing of the sync pattern included in the data received by the receiving unit and the detecting unit further comprises a transmission frequency detecting circuit which detects the transmission clock frequency by adding the frequency difference to a frequency of the reception clock frequency.

19. The data communication system according to claim 1, wherein the data wirelessly-transmitted from the transmitting device includes a preamble pattern, and the frequency synchronization circuit detects the frequency difference from the preamble pattern included in the data wirelessly-received by the receiving unit.

20. A receiving device comprises:

a receiving unit which wirelessly-receives a data generated in synchronization with a clock having a temperature characteristic in that a clock frequency varies with temperature from a data transmitting device;

a reception clock generating circuit which generates a clock;

a detecting unit comprising a frequency synchronization circuit which detects a frequency difference between a transmission clock frequency of the transmitting device and the reception clock frequency of the receiving device by using the reception clock frequency and the data wirelessly-received by the receiving unit wherein the transmission clock frequency is the frequency of the clock of the data transmitting device and the reception clock frequency is the frequency of the clock generated by the reception clock generating circuit;

a storage unit which stores temperature characteristic information regarding the temperature characteristic of the clock of the data transmitting device; and a calculating unit which calculates a temperature of the data transmitting device based on the frequency difference detected by the detecting unit and the temperature characteristic information stored in the storage unit.

21. The receiving device according to claim 20, wherein the storage unit stores the temperature characteristic information indicating a relation of the temperature of the clock of the data transmitting device with the transmission clock frequency obtained from the frequency difference and the reception clock frequency.

22. The receiving device according to claim 20, wherein the detecting unit further comprises a transmission frequency detecting circuit which detects the transmission clock frequency from the frequency difference and the reception clock frequency.

23. The receiving device according to claim 20, wherein the frequency synchronization circuit generates a first clock signal synchronized with the transmission clock frequency based on the data wirelessly-received by the receiving unit and the clock generated by the reception clock generating circuit, and detects the frequency difference by detecting a difference between the frequency of the first clock signal and the reception clock frequency.

24. The receiving device according to claim 23, wherein the data wirelessly-transmitted from the data transmitting device includes a sync pattern periodically inserted into the data, and the frequency synchronization circuit generates the first clock signal based on the sync pattern included in the data wirelessly-received by the receiving unit and the clock generated by the reception clock generating circuit.

25. The receiving device according to claim 23, wherein the data wirelessly-transmitted from the data transmitting device includes a preamble pattern, and the frequency synchronization circuit generates the first clock signal based on the preamble pattern included in the data wirelessly-received by the receiving unit and the clock generated by the reception clock generating circuit.

26. The receiving device according to claim 20, wherein the temperature characteristic information is a representative temperature characteristic value of the clock of the data transmitting device.

27. The receiving device according to claim 20, wherein the receiving device further comprises a selecting unit which selects one piece of temperature characteristic information from a plurality of pieces of the temperature characteristic information based on the data wirelessly-received by the receiving unit.

28. The receiving device according to claim 27, wherein the data wirelessly-transmitted from the data transmitting device includes identification information used to identify the temperature characteristic information, and the selecting unit selects the temperature characteristic information based on the identification information.

29. The receiving device according to claim 20, wherein the receiving unit further receives the temperature characteristic information from an external device, and the storage unit stores the temperature characteristic information received by the receiving unit.

30. The receiving device according to claim 20, wherein the receiving unit further receives the temperature characteristic information from the data transmitting device, and the storage unit stores the temperature characteristic information received by the receiving unit.

31. The receiving device according to claim 29, wherein the receiving unit comprises:

a first receiving circuit which wirelessly-receives the data wirelessly-transmitted from the data transmitting device; and a second receiving circuit which receives the temperature characteristic information transmitted from the external device.

32. The receiving device according to claim 20, wherein the data wirelessly-transmitted from the data transmitting device includes a sync pattern periodically inserted into the data, and the frequency synchronization circuit detects the frequency difference from the sync pattern included in the data received by the receiving unit.

33. The receiving device according to claim 32, wherein the frequency synchronization circuit detects the frequency difference by measuring a timing of the sync pattern included in the data received by the receiving unit, and the detecting unit further comprises a transmission frequency detecting circuit which detects the transmission clock frequency by adding the frequency difference to a frequency of the reception clock frequency.

34. The receiving device according to claim 20, wherein the data wirelessly-transmitted from the data transmitting device includes a preamble pattern, and the frequency synchronization circuit detects the frequency difference from the preamble pattern included in the data wirelessly-received by the receiving unit.

* * * * *